United States Patent
Lee et al.

(10) Patent No.: US 9,607,852 B2
(45) Date of Patent: Mar. 28, 2017

(54) METHODS OF DIVIDING LAYOUTS AND METHODS OF MANUFACTURING SEMICONDUCTOR DEVICES USING THE SAME

(71) Applicant: SAMSUNG ELECTRONICS CO., LTD., Suwon-Si, Gyeonggi-Do (KR)

(72) Inventors: Jeong-Hoon Lee, Yongin-Si (KR); Sang-Wook Seo, Seoul (KR); Hye-Soo Shin, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 302 days.

(21) Appl. No.: 14/261,299

(22) Filed: Apr. 24, 2014

(65) Prior Publication Data

US 2015/0011022 A1    Jan. 8, 2015

(30) Foreign Application Priority Data

Jul. 8, 2013  (KR) ........................ 10-2013-0079502

(51) Int. Cl.
*H01L 21/31*    (2006.01)
*H01L 21/469*   (2006.01)
*H01L 21/311*   (2006.01)
*G03F 7/20*     (2006.01)
*H01L 21/027*   (2006.01)
(Continued)

(52) U.S. Cl.
CPC .... *H01L 21/31144* (2013.01); *G03F 7/70283* (2013.01); *G03F 7/70466* (2013.01);
(Continued)

(58) Field of Classification Search
CPC ... H01L 2221/1036; H01L 2224/05552; H01L 2224/05571; H01L 21/0332;
(Continued)

(56) References Cited

U.S. PATENT DOCUMENTS 7,022,600 B2 * 4/2006 Kim ................. H01L 21/76808
                                                      257/E21.579
7,052,621 B2 * 5/2006 Kumar ............... H01L 21/0332
                                                      216/51
(Continued)

FOREIGN PATENT DOCUMENTS

KR    10-2009-0054235    5/2009
KR    10-1226652         1/2012
(Continued)

*Primary Examiner* — Kyoung Lee
*Assistant Examiner* — Joannie A Garcia
(74) *Attorney, Agent, or Firm* — F. Chau & Associates, LLC

(57) ABSTRACT

Target pattern layouts that include lower and upper target patterns are designed. Each lower target pattern is combined with a upper target pattern that at least partially overlaps a top surface thereof to form combination structures. The combination structures are divided into first and second combination structures. A first target pattern is formed from the lower target pattern in the first combination structure and a third target pattern is formed from the upper target pattern in the first combination structure. The first and third target patterns are formed in first and third lithography processes, respectively. A second target pattern is formed from the lower target pattern in the second combination structure and a fourth target pattern is formed from the upper target pattern in the second combination structure. The second and fourth target patterns are formed in second and fourth lithography processes, respectively.

11 Claims, 15 Drawing Sheets

(51) Int. Cl.
*H01L 21/3213* (2006.01)
*H01L 21/768* (2006.01)

(52) U.S. Cl.
CPC ...... *G03F 7/70633* (2013.01); *H01L 21/0274* (2013.01); *H01L 21/32139* (2013.01); *H01L 21/76816* (2013.01); *H01L 21/76838* (2013.01)

(58) Field of Classification Search
CPC ............. H01L 21/0337; H01L 21/3086; H01L 21/31116; H01L 21/31144; H01L 21/32139; H01L 21/68; H01L 21/68757; H01L 21/76807; H01L 21/76811; H01L 21/76816; H01L 21/76897; H01L 27/0207; H01L 27/11519
USPC ....... 438/700–703, 717, 761, 763, 778, 942, 438/946, 975, FOR. 307; 716/50, 55, 716/119, FOR. 120, FOR. 491
See application file for complete search history.

(56) References Cited

U.S. PATENT DOCUMENTS

| | | | |
|---|---|---|---|
| 8,058,177 B2 | 11/2011 | Weiss et al. | |
| 8,146,026 B2 | 3/2012 | Agarwal et al. | |
| 8,359,556 B1 | 1/2013 | Abou Ghaida et al. | |
| 8,381,139 B2 | 2/2013 | Lin et al. | |
| 8,584,052 B2 | 11/2013 | Chen et al. | |
| 8,603,905 B2* | 12/2013 | Blatchford | G03F 7/70633 257/E21.575 |
| 2003/0008490 A1* | 1/2003 | Xing | H01L 21/31144 438/622 |
| 2003/0211751 A1* | 11/2003 | Lin | B82Y 10/00 438/717 |
| 2010/0025858 A1* | 2/2010 | Weiss | H01L 21/76816 257/774 |
| 2011/0003254 A1 | 1/2011 | Chang et al. | |
| 2011/0078638 A1 | 3/2011 | Kahng et al. | |
| 2011/0197168 A1 | 8/2011 | Chen et al. | |
| 2011/0271238 A1 | 11/2011 | Mansfield et al. | |
| 2012/0196230 A1 | 8/2012 | Cho et al. | |
| 2012/0210279 A1 | 8/2012 | Hsu et al. | |
| 2012/0313251 A1* | 12/2012 | Kato | H01L 21/76816 257/773 |
| 2013/0032712 A1 | 2/2013 | Shih et al. | |

FOREIGN PATENT DOCUMENTS

| | | |
|---|---|---|
| KR | 10-2012-0048904 | 5/2012 |
| KR | 10-2012-0055517 | 5/2012 |
| KR | 10-2012-0071302 | 7/2012 |

* cited by examiner

METHODS OF DIVIDING LAYOUTS AND METHODS OF MANUFACTURING SEMICONDUCTOR DEVICES USING THE SAME

CROSS-REFERENCE TO RELATED APPLICATION

This application claims priority under 35 USC §119 from Korean Patent Application No. 10-2013-0079502, filed on Jul. 8, 2013 in the Korean Intellectual Property Office (KIPO), and all the benefits accruing therefrom, the contents of which are herein incorporated by reference in their entirety.

BACKGROUND

1. Technical Field

Exemplary embodiments of the present disclosure are directed to methods of dividing layouts and methods of manufacturing semiconductor devices using the same. More particularly, exemplary embodiments of the present disclosure are directed to methods of dividing layouts for defining exposure masks and methods of manufacturing semiconductor devices using the same.

2. Discussion of the Related Art

As semiconductor devices have become more integrated, double or multiple patterning processes that accompany at least two photolithography steps may be utilized to form patterns of the semiconductor devices. In a pattering process, patterns may be determined for each photolithography step, and an exposure mask for each photolithography process may be prepared. First and second patterns may be formed in the first layer conductive pattern by first and second exposure processes, respectively, and third and fourth patterns may be formed in the second pattern by the first and second exposure processes, respectively. Thus, a layout dividing step may be carried out for a layout of a target pattern that divides the patterns for each photolithography step.

SUMMARY

Exemplary embodiments provide a method of dividing a layout capable of reducing an overlay defect.

Exemplary embodiments provide a method of manufacturing a semiconductor device capable of reducing an overlay defect.

According to exemplary embodiments, there is provided a method of dividing a target pattern layout. In the method, target pattern layouts that include lower target patterns and upper target patterns are designed. Each lower target pattern is combined with an upper target pattern that at least partially overlaps with a top surface of the lower target pattern to form combination structures. The combination structures are divided into a first combination structure and a second combination structure. A first target pattern is formed from the lower target pattern in the first combination structure and a third target pattern is formed from the upper target pattern in the first combination structure. The first and third target patterns are formed in first and third lithography processes, respectively. A second target pattern is formed from the lower target pattern in the second combination structure and a fourth target pattern is formed from the upper target pattern in the second combination structure. The second and fourth target patterns are formed in second and fourth lithography processes, respectively.

In exemplary embodiments, the method may include aligning the lower and upper target patterns in the combination structure with each other.

In exemplary embodiments, the lower and upper target patterns in the combination structure maybe in contact with each other.

In exemplary embodiments, the lower target patterns may include line patterns and the upper target patterns may include contact plugs. The contact plugs may be in contact with top surfaces of the line patterns in combination structure.

In exemplary embodiments, the first to fourth target patterns are formed using first to fourth exposure masks. The first to fourth exposure masks may differ from each other.

In exemplary embodiments, the method may include inspecting the first to fourth exposure masks to judge suitability for forming the first to fourth target patterns.

In exemplary embodiments, the method may include redividing the combination structures if the first to fourth masks are judged as unsuitable for forming the first to fourth target patterns.

In exemplary embodiments, the steps of designing the layout of the target patterns, combining each of the lower target patterns with the upper target pattern to form the combination structures, dividing the combination structures into the first combination structure and the second combination structure, forming the first target pattern and the third target pattern, and forming the second target pattern and the fourth target pattern may be performed using a computer.

According to exemplary embodiments, there is provided a method of manufacturing a semiconductor device. The method includes designing target pattern layouts that include lower target patterns and upper target patterns are designed. Each lower target pattern is combined with an upper target pattern that at least partially overlaps with a top surface of the lower target pattern to form combination structures. The combination structures are divided into a first combination structure and a second combination structure. The first combination structure and the second combination structure are respectively formed by a first exposure process and a second exposure process. First to fourth exposure masks are formed. The first exposure mask and the third exposure mask are used for forming the lower target pattern and the upper target pattern in the first combination structure. The second exposure mask and the fourth exposure mask may be used for forming the lower target pattern and the upper target pattern in the second combination structure. A first lower pattern is formed from a first object layer on a substrate using the first exposure mask in a first lithography process. A second lower pattern is formed from the first object layer using the second exposure mask in a second lithography process. An insulating interlayer and a second object layer are formed on the first and second lower patterns. A first upper pattern is formed from the second object layer using the third exposure mask in a third lithography process. A second upper pattern is formed from the second object layer using the fourth exposure mask in a fourth lithography process.

In exemplary embodiments, the method may include aligning the lower and upper target patterns in the combination structure with each other.

In exemplary embodiments, the lower target pattern may include line patterns and the upper target pattern may include contact plugs in contact with top surfaces of the line patterns. The line patterns and the contact plugs in contact with the line patterns form the combination structure.

In exemplary embodiments, the method may include etching the insulating interlayer using the first and second upper patterns as an etching mask to form a contact hole, and filling the contact hole with a conductive material to form the contact plug.

In exemplary embodiments, the method may include inspecting the first to fourth exposure masks judge suitability for forming the first to fourth target patterns In exemplary embodiments, the method may include forming a first overlay key in the first lithography process and forming a second overlay key in the second lithography process.

In exemplary embodiments, the method may include aligning the third exposure mask using the first overlay key in the third lithography process and aligning the fourth exposure mask using the second overlay key in the fourth lithography process.

According to exemplary embodiments, there is provided a method of manufacturing a semiconductor device. The method includes forming first lower target patterns in a first exposure process using a first exposure mask, forming first upper target patterns in the first exposure process using a third exposure mask, forming second lower target patterns in a second exposure process using a second exposure mask, and forming second upper target patterns in the second exposure process using a fourth exposure mask. The first and second lower target patterns and the first and second upper target patterns are line patterns. The first and second upper target patterns are aligned with the first and second lower target patterns from target pattern layouts, respectively. The first lower target patterns and the first upper target patterns are combined to form a first combination structure; and the second lower target patterns and the second upper target patterns are combined to form a second combination structure. The lower and upper target patterns are combined using target pattern layouts that are divided into lower target pattern layouts and upper target pattern layouts.

In exemplary embodiments, the method may include inspecting the first to fourth exposure masks to judge whether the first to fourth exposure masks are suitable for forming the first to fourth target patterns. If the first to fourth exposure masks are judged as unsuitable for forming the first to fourth target patterns, the target pattern layouts may be redivided into lower target pattern layouts and upper target pattern layouts, and the lower and upper target patterns may be recombined into a different structure.

In exemplary embodiments, the method may include forming first middle target patterns in the first exposure process using a fifth exposure mask, forming second middle target patterns in the second exposure process using a sixth exposure mask, aligning the first middle target patterns with the first lower and upper target patterns, and the second middle target patterns with the second lower and upper target patterns, and combining the first middle target patterns with the first lower and upper target patterns, and the second middle target patterns with the second lower and upper target patterns. The first and second middle target patterns may include contact plugs that respectively connect the first lower and upper target patterns, and the second lower and upper target patterns, and the target pattern layouts may be further divided into middle target pattern layouts.

In exemplary embodiments, the method may include inspecting the first to sixth exposure masks to judge whether the first to fourth exposure masks are suitable for forming the first to fourth target patterns. If the first to sixth exposure masks are judged as unsuitable for forming the first to fourth target patterns, the target pattern layouts may be redivided into lower target pattern layouts, middle target pattern layouts, and upper target pattern layouts, and the lower, middle, and upper target patterns may be recombined into a different structure.

According to exemplary embodiments, overlay defects between upper and lower patterns may be reduced, which may enhance manufacturing process reliability of a semiconductor device.

DETAILED DESCRIPTION OF EXEMPLARY EMBODIMENTS

Figure 1:
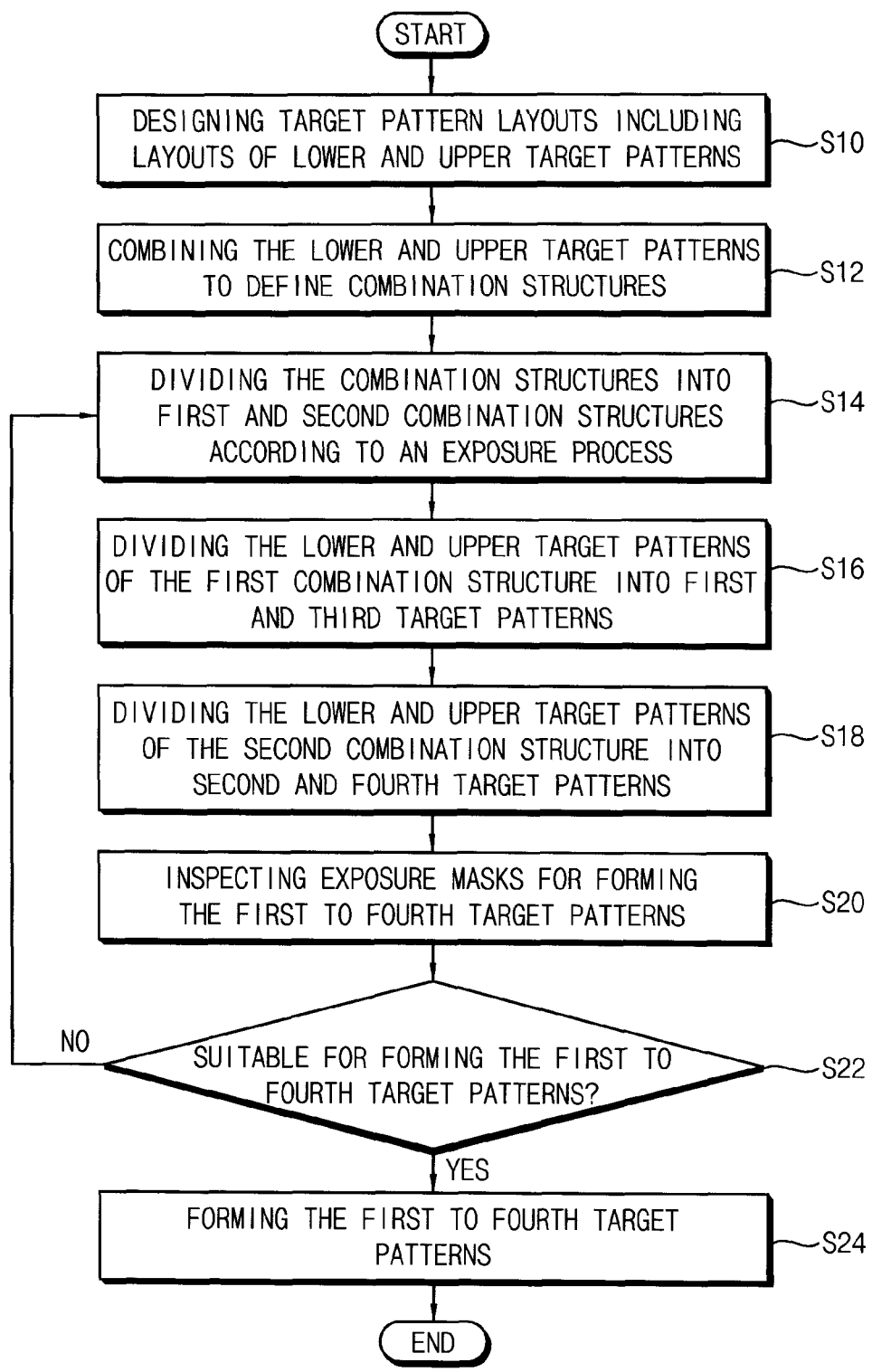
FIG. 1 is a flowchart that illustrates a method of dividing a layout in accordance with exemplary embodiments.

Various exemplary embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that if an element or layer is referred to as being "on," "connected to" or "coupled to" another element or layer, it can be directly on, connected or coupled to the other element or layer or intervening elements or layers may be present.

Figure 2:
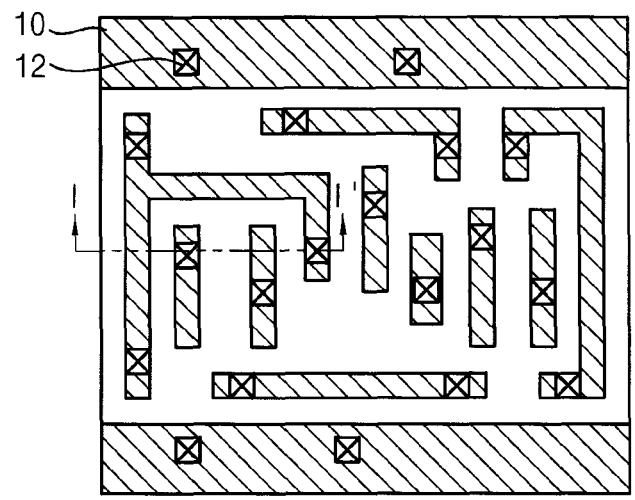
FIG. 2 is a top-plan view that illustrates a layout of target patterns in accordance with exemplary embodiments.

FIG. 1 is a flowchart that illustrates a method of dividing a layout in accordance with exemplary embodiments. FIG. 2 is a top-plan view that illustrates a layout of a target pattern in accordance with exemplary embodiments. FIGS. 3A to 3D are top-plan views that illustrate a method of dividing the layout of FIG. 2.

According to exemplary embodiments, a target pattern may include two layers of patterns. The patterns of each layer may be formed by at least two exposure processes. The patterns of each layer may be formed by patterning a film from the same deposition process. Hereinafter, the patterns of each layer are defined as being formed by two exposure processes.

Each step described below may be performed using a computer system. For example, a computer program for carrying out the steps of dividing the layout may be executed in the computer system.

A target pattern layout having two layers of patterns may be designed in step S10. The target patterns may include lower target patterns 10 and upper target patterns 12. The lower target patterns 10 may include line patterns, such as metal lines. A line pattern may include either a line structure that bends or a line structure that does not bend. The upper target patterns 12 may include contact plugs, such as via contacts that make contact with the top surfaces of the lower target patterns. At least one contact plug may be in contact with each line pattern. The upper target patterns 12 may be aligned with the lower target patterns 10.

Figure 3A:
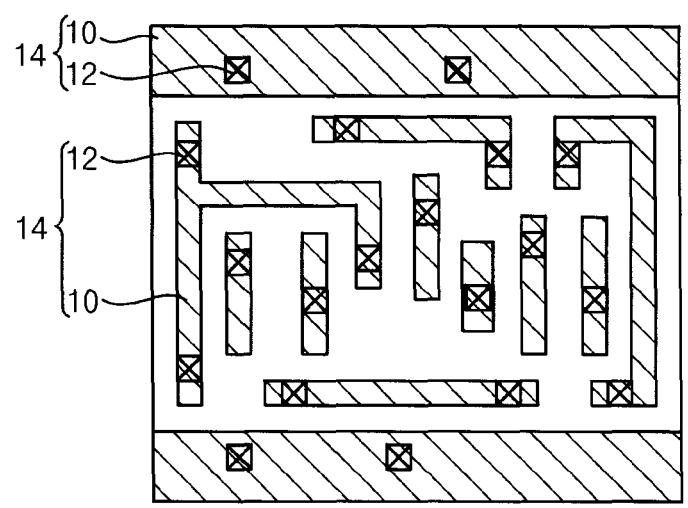
FIGS. 3A to 3D are top-plan views that illustrate a method of dividing the layout of FIG. 2.

Referring to FIG. 3A, each of the lower target patterns 10 and upper target patterns 12 may be combined in step S12. The lower and upper target patterns 10 and 12 in the combination may overlap or make contact with each other. In exemplary embodiments, each of the lower target patterns 10 and upper target patterns 12 that contact the lower target pattern 10 may be combined.

Thus, a lower target pattern 10 and upper target pattern 12 formed in different layers may define a combination structure 14. The combination structure 14 may include a line pattern and contact plugs making contact with a top surface of the line pattern. Accordingly, a layout of the combination structure 14 may be created.

Figure 3B:
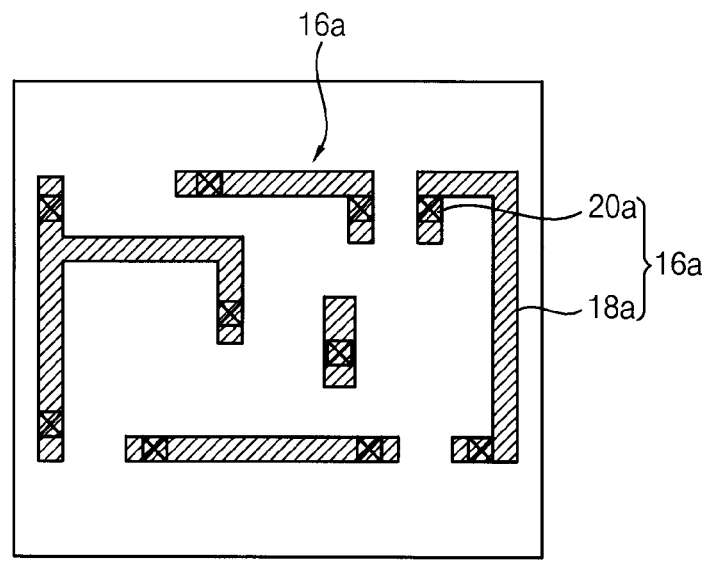
Figure 3C:
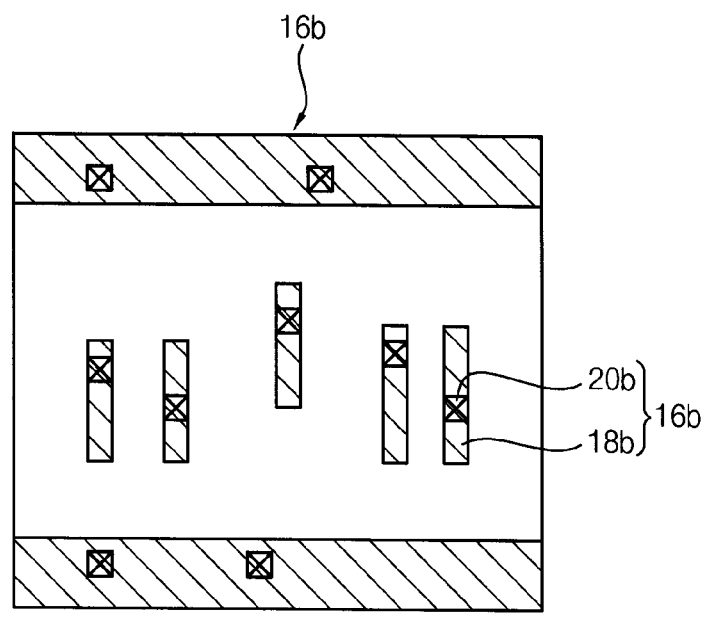

Referring to FIGS. 3B and 3C, the combination structure 14 may be divided according to each exposure process in step S14. For example, the combination structure 14 may be divided into a combination structure 16a formed in a first exposure process and a combination structure 16b formed in a second exposure process.

The combination structure 14 illustrated in FIG. 3B may be the first combination structure 16a. The combination structure 14 illustrated in FIG. 3C may be the second combination structure 16b.

The combination structure 14 may be divided into the first and second combination structures 16a and 16b, to not simultaneously expose adjacent patterns. For example, the first combination structure 16a may be selected to have a pitch suitable for the wavelength of a light source and the numerical aperture (NA) of an exposure apparatus. The combination structures that remain after selecting the first combination structures 16a may be selected as the second combination structures 16b.

In exemplary embodiments, each layer pattern may be formed by two photolithography processes, and thus the first and second combination structures 16a and 16b may each be further divided into two groups. However, when a pattern density increases, each layer pattern may be formed by at least three exposure processes. In this case, each combination structure may be divided into at least three groups.

The upper and lower target patterns 12 and 10 in the first combination structure 16a may be formed by the first exposure process, and the upper and lower target patterns 12 and 10 in the second combination structure 16b may be formed by the second exposure process.

In steps S16 and S18, the lower target pattern 10 in the first combination structure 16a may be a first target pattern 18a formed by the first exposure process. The lower target pattern 10 in the second combination structure 16b may be a second target pattern 18b formed by the second exposure process. The upper target pattern 12 in the first combination structure 16a may be a third target pattern 20a formed by the first exposure process. The upper target pattern 12 in the second combination structure 16b may be a fourth target pattern 20b formed by the second exposure process.

A different exposure mask may be used for each exposure processes, so that four different exposure masks may be used for forming the divided patterns.

The first target pattern 18a in the first combination structure 16a may be formed using a first exposure mask. The third target pattern 20a in the first combination structure 16a may be formed using a third exposure mask. For example, the first exposure mask may transfer the first target pattern 18a in the first exposure process. The third exposure mask may transfer the third target pattern 20a in the third exposure process.

Figure 3D:
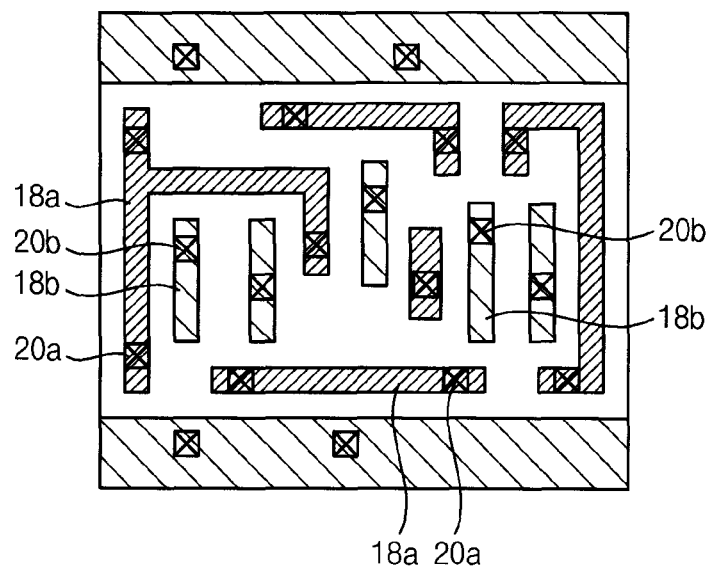

The second target pattern 18b in the second combination structure 16b may be formed using a second exposure mask. The fourth target pattern 20b in the second combination structure 16b may be formed by a fourth exposure mask. For example, the second exposure mask may transfer the second target pattern 18b in the second exposure process. The fourth exposure mask may be transferred to the fourth target pattern 20b the fourth exposure process. FIG. 3D illustrates first to fourth target patterns divided from the conductive patterns using the first to the fourth exposure masks.

The first to fourth exposure masks for forming the first to fourth target patterns 18a, 18b, 20a and 20b may be inspected in step S20. In the inspection step, the first to fourth exposure masks may be checked to determine whether each would respectively yield the first to the fourth target patterns 18a, 18b, 20a and 20b in an exposure process.

In step S22, it is determined whether each of the first to fourth exposure masks is suitable for forming the respective first to the fourth target patterns 18a, 18b, 20a and 20b. If the first to fourth exposure masks are suitable, the first to fourth target patterns 18a, 18b, 20a and 20b may be formed in step S24.

Alternatively, if any of the first to fourth exposure masks are judged as unsuitable for forming the first to fourth target patterns 18a, 18b, 20a and 20b, the combination structures may be redivided in a different design, and the subsequent steps may be repeated.

As described above, the lower and upper target patterns 10 and 12 may be combined to form the combination structure 14, and the combination structure 14 may be treated as one pattern structure and divided. Thus, the target patterns 10 and 12 may be easily divided by one dividing process.

Further, the upper target pattern formed by a first exposure process may be located on the lower target pattern formed by the first exposure process. Likewise, the upper target pattern formed by a second exposure process may be located on the lower target pattern formed by the second exposure process. Thus, the third exposure mask for forming the upper target patterns by the first exposure process may be aligned with the lower target pattern formed by the first exposure process. Likewise, the fourth exposure mask for forming the remaining upper target pattern by the second exposure process may be aligned with the lower target pattern formed by the second exposure process. Accordingly, in each exposure process for forming an upper target pattern, the exposure mask need not be aligned with the entire lower target pattern, but rather a portion of the lower target pattern. Thus, the exposure mask may be easily aligned, which may reduce an overlay defect of the third and fourth exposure masks.

Figure 4:
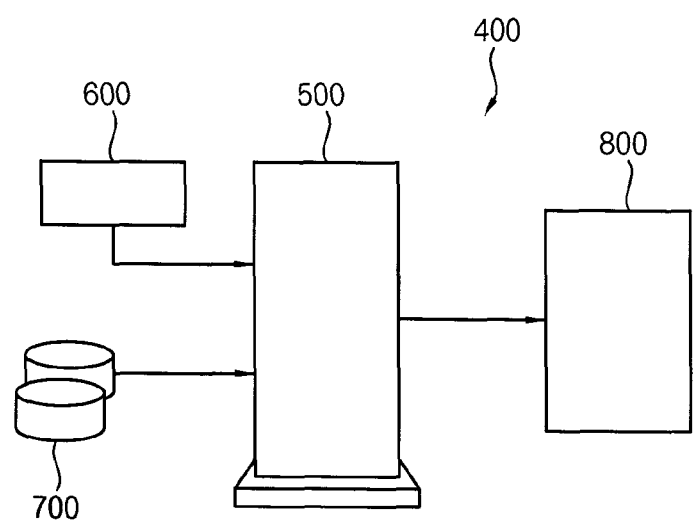
FIG. 4 is a block diagram that illustrates a system for dividing a layout in accordance with exemplary embodiments.

FIG. 4 is a block diagram that illustrates a system for dividing a layout in accordance with exemplary embodiments.

Referring to FIG. 4, a computing system 400 may include a computing system 500, a program storage device 600, a layout file storage 700, and a mask recording device 800. The computing device 500 can divide a layout and may be a general computer or a workstation. The computing device 500 may be a stand-alone type or a network type. The computing device 500 may include a single-core processor or a multi-core processor, and may be capable of parallel processing. The computing device 500 may include a computer program stored in the program storage device 600, such as a compact disk (CD) or a digital video disk (DVD). Alternatively, the computing device 500 may execute a series of instructions through wired or wireless networks. The computing device 500 may read with a file that has layout information from the layout file storage 700, such as a database or other storage device, and may execute instructions for reading the file.

The computing device 500 may execute a computer program to perform the steps of dividing the layout according to exemplary embodiments. For example, their computer system device may perform the step of combining upper and lower target patterns from a designed layout into a combination structure, the step of dividing the combination structure into first and second combination structures, the step of dividing the first combination structure into first and third target patterns and dividing the second combination structure into second and fourth target patterns, and the step of inspecting and determining whether the first to the fourth target patterns are suitable. The divided layout may be transferred to the mask recording device 800, and photomasks for exposure processes may be determined and manufactured.

The computer system 400 may include a storage mechanism for storing a designed layout and a divided layout, a computing mechanism for forming a combination structure from the designed layout, dividing the combination structure into first and second combination structures and dividing each of the first and second combination structures, and a judgment mechanism for inspection and determining steps.

A method of dividing the layout according to exemplary embodiments may be tangibly recorded as computer readable code in a storage device. The storage device may include various types of storage media readable by the computer, for example, a ROM, a RAM, a CD-ROM, a DVD, a magnetic tape, a floppy disk, an optical data storage device, a flash memory device, a device using a carrier wave, etc. The storage device may be connected to the computing system connected by a network, and the computer readable code may be stored and executed over the network. The program or codes stored in the storage device may include a series of instructions utilized directly or indirectly to obtain particular results in an information processing device, e.g., the computer. The computer may include all information processing devices that may have a memory, input/output devices and a processing device to carry out particular activities by the program.

Programmed instructions for performing the step of combining the upper and lower target patterns from the designed layout into the combination structure, the step of dividing the combination structure into the first and second combination structures, the step of dividing the first combination structure into the first and third target patterns and dividing the second combination structure into the second and fourth target patterns, and the step of inspecting and determining the first to the fourth target patterns, may be stored in the storage device.

FIGS. 5A to 5J are cross-sectional views that illustrate a method of manufacturing a semiconductor device in accordance with exemplary embodiments. FIGS. 5A to 5J may be cross-sectional views taken along line I-I' line of FIG. 2.

Figure 5A:
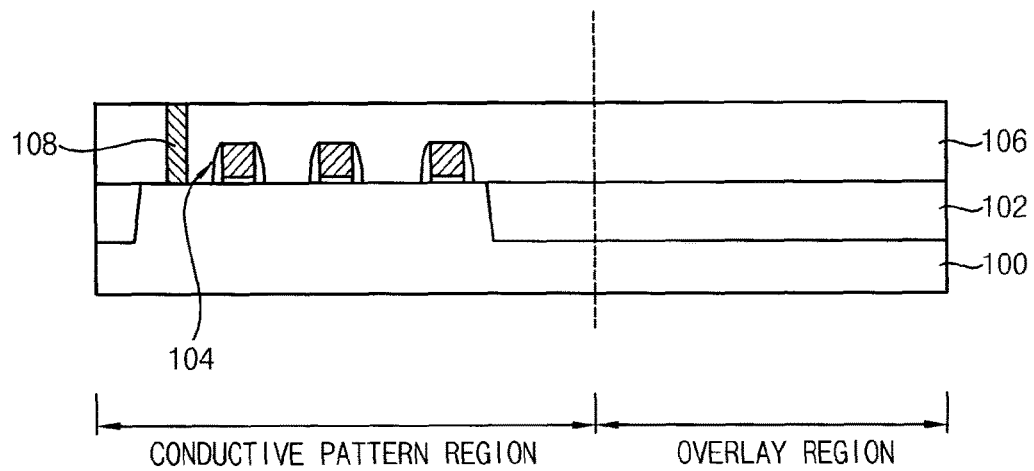
FIGS. 5A to 5J are cross-sectional views taken along a line I-I' line of FIG. 2 that illustrate a method of manufacturing a semiconductor device in accordance with exemplary embodiments.

Referring to FIG. 5A, an isolation layer pattern 102 may be formed on a substrate 100 by, e.g., a shallow trench isolation (STI) process. The substrate 100 may be divided into a conductive pattern region and an overlay region. The substrate 100 may be, for example, a silicon substrate.

A front end of the line (FEOL) process may be performed on the substrate 100 to form a lower structure. The lower structure may include a transistor 104, a lower wiring 108 and a lower insulating interlayer 106. The lower wiring 108 may include a contact plug.

Two layers of conductive patterns may be formed on the lower insulating interlayer 106 by a double patterning process. In this case, each conductive pattern may be divided according to the exposure processes. For example, a first layer conductive pattern may be divided according to a first exposure process and a second exposure process, and a second layer conductive pattern may be divided according to the first exposure process and the second exposure process. In addition, first and second exposure masks may be determined for use in the first and second exposure processes to form the first layer conductive pattern. Similarly, third and fourth exposure masks may be determined for use in the first and second exposure processes to form the second layer conductive pattern.

A lower conductive pattern of the conductive patterns may be substantially a line pattern. An upper conductive pattern of the conductive patterns may be substantially a contact plug.

The first to fourth exposure masks may be determined by the method of dividing the layout illustrated with reference to FIG. 1. For example, in the case of the layout illustrated in FIG. 2, the conductive patterns may be divided into first to fourth target patterns using the first to the fourth exposure masks as illustrated in FIG. 3D. The layout division may be carried out using a computing system. The upper conductive pattern may be aligned with the lower conductive pattern.

The lower conductive pattern and the upper conductive pattern may be combined with each other. In exemplary embodiments, the line pattern and the contact plug in contact therewith may be combined into a combination structure.

Each combination structures may be divided according to the exposure processes. For example, the combination structures may be divided into a first combination structure formed in the first exposure process and a second combination structure formed in the second exposure process.

The lower and upper conductive patterns in the first combination structure may be formed in the first exposure process, and the lower and upper conductive patterns in the second combination structure may be formed in the second exposure process. Further, the first and second exposure masks for forming the lower conductive patterns, and the third and fourth exposure masks for forming the upper conductive patterns may be determined.

If the first to fourth exposure masks are checked and judged as being suitable for forming the conductive patterns, the layout may be divided.

In the case that the first to fourth exposure masks are judged as being unsuitable for forming predetermined target patterns, the combination structures may be redivided in a different design and the subsequent steps may be repeated.

Figure 5B:
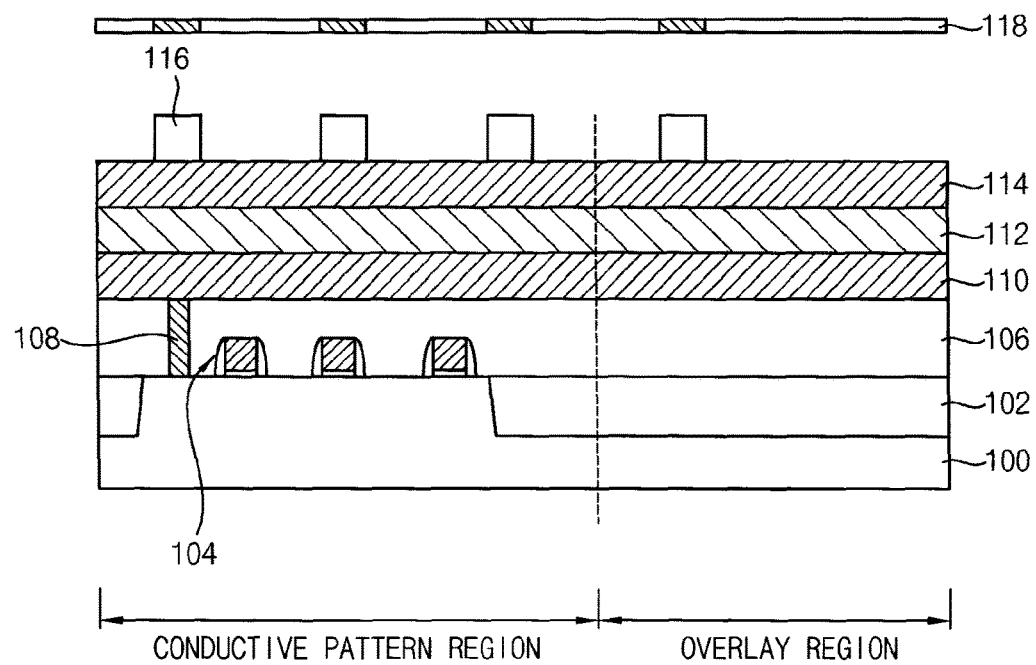

Referring to FIG. 5B, a first conductive layer 110 may be formed on the lower insulating interlayer 106. A first hard mask layer 112 may be formed on the first conductive layer 110. A second hard mask layer 114 may be formed on the first hard mask layer 112. The first and second hard mask layers 112 and 114 may be formed using different materials to have different etching properties, such as different etching selectivities.

A first photoresist layer may be coated on the second hard mask layer 114. The first photoresist layer may be exposed using a first exposure mask 118. The exposure process with respect to the first photoresist layer may correspond to a first exposure process for forming a lower conductive pattern. Using the first exposure mask 118, the lower conductive pattern in a first combination structure may be transferred to the first photoresist layer by the exposure process. A first photoresist pattern 116 may be formed by a developing process.

Figure 5C:
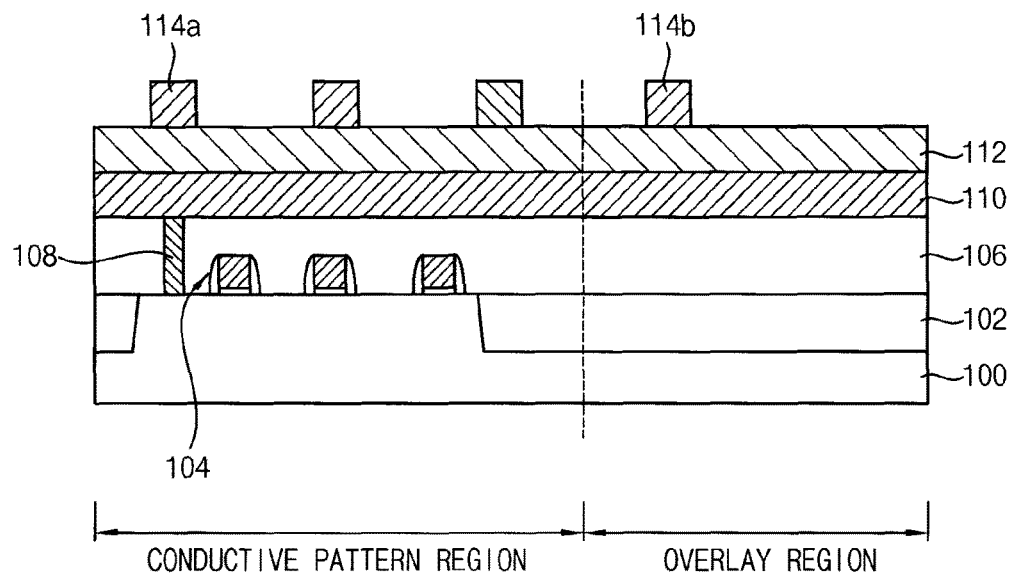

Referring to FIG. 5C, the second hard mask layer 114 may be etched using the first photoresist pattern 116 as an etching mask to form a preliminary mask pattern 114a. The preliminary mask pattern 114a may be formed on a portion of a region in which the lower conductive pattern is formed. In exemplary embodiments, a first overlay pattern 114b for preventing pattern misalignments may also be formed on the overlay region during the etching process. The first photoresist pattern 116 may be removed.

Figure 5D:
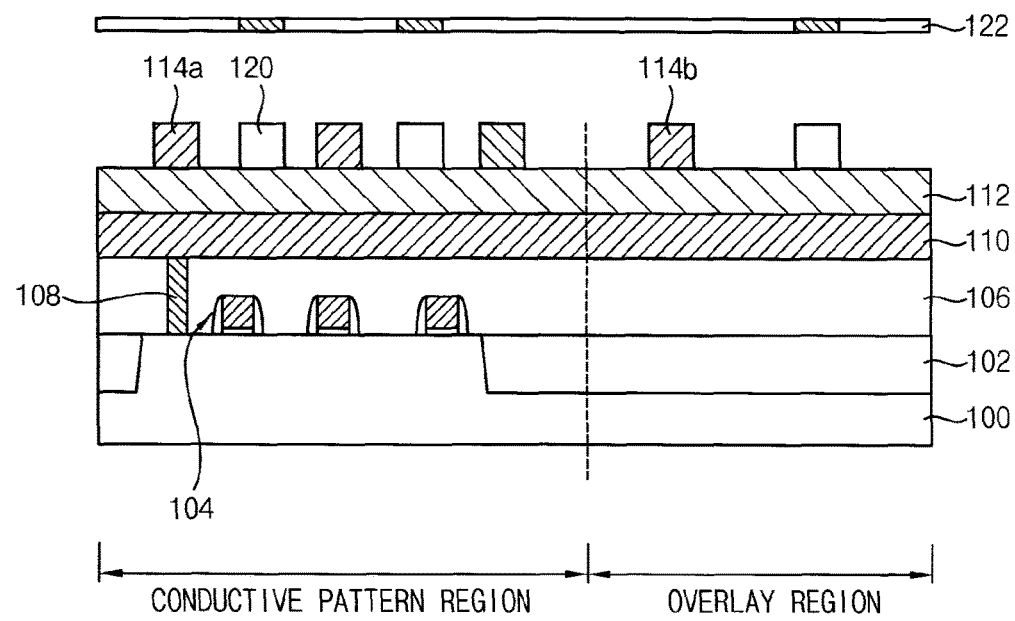

Referring to FIG. 5D, a second photoresist layer may be coated on the preliminary mask pattern 114a and the first hard mask layer 112. The second photoresist layer may be exposed using a second exposure mask 122. The exposure process with respect to the second photoresist layer may correspond to a second exposure process for forming the lower conductive pattern. In the second exposure process, the second exposure mask 122 may be aligned with reference to the first overlay pattern 114b. Using the second exposure mask 122, the lower conductive pattern in a second combination structure may be transferred to the second photoresist layer by the exposure process. A second photoresist pattern 120 may be formed by a developing process.

Figure 5E:
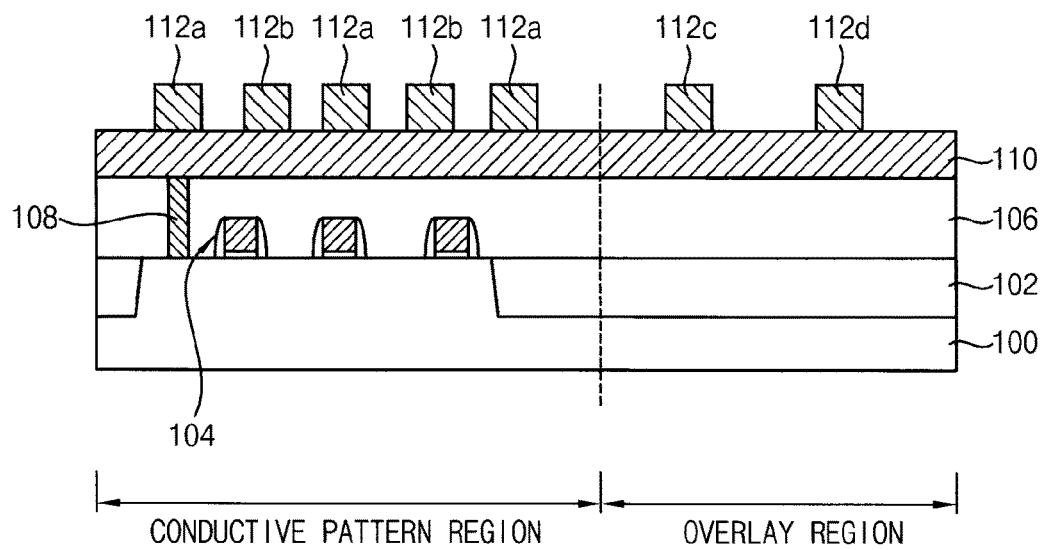

Referring to FIG. 5E, the first hard mask layer 112 may be etched using the second photoresist pattern 120 and the preliminary mask pattern 114a as an etching mask to form mask patterns 112a and 112b. In addition, a first overlay pattern 112c and a second overlay pattern 112d for preventing pattern misalignments may also be formed on the overlay region during the etching process.

The mask patterns may include a first mask pattern 112a formed in the first exposure process and a second mask pattern 112b formed in the second exposure process.

Figure 5F:
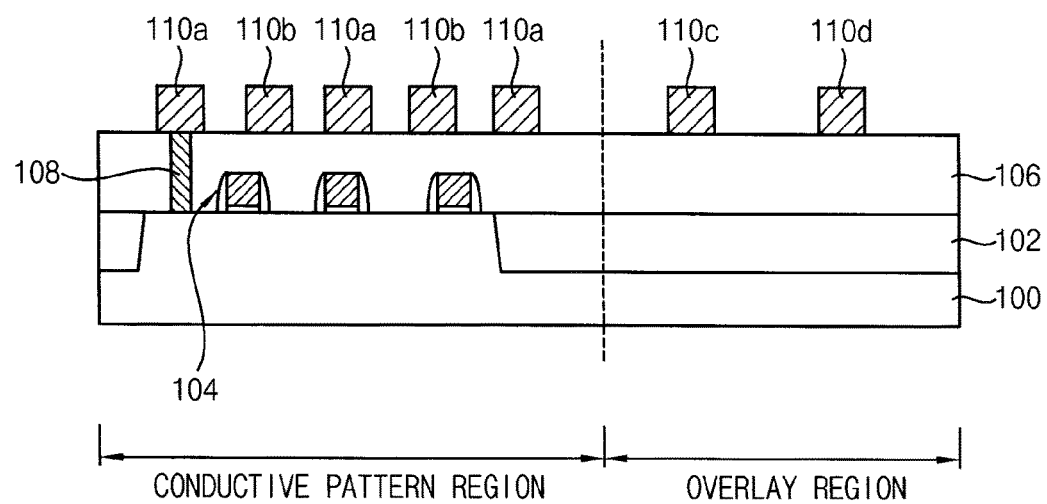

Referring to FIG. 5F, the first conductive layer 110 may be etched using the first and second mask patterns 112a and 112b as etching masks to form the lower conductive patterns. The lower conductive patterns may be substantially line shaped. The lower conductive patterns may include a first lower conductive pattern 110a formed by the first mask pattern 112a and a second lower conductive pattern 110b formed by the second mask pattern 112b. First and second overlay keys 110c and 110d may also be formed by the etching process.

Figure 5G:
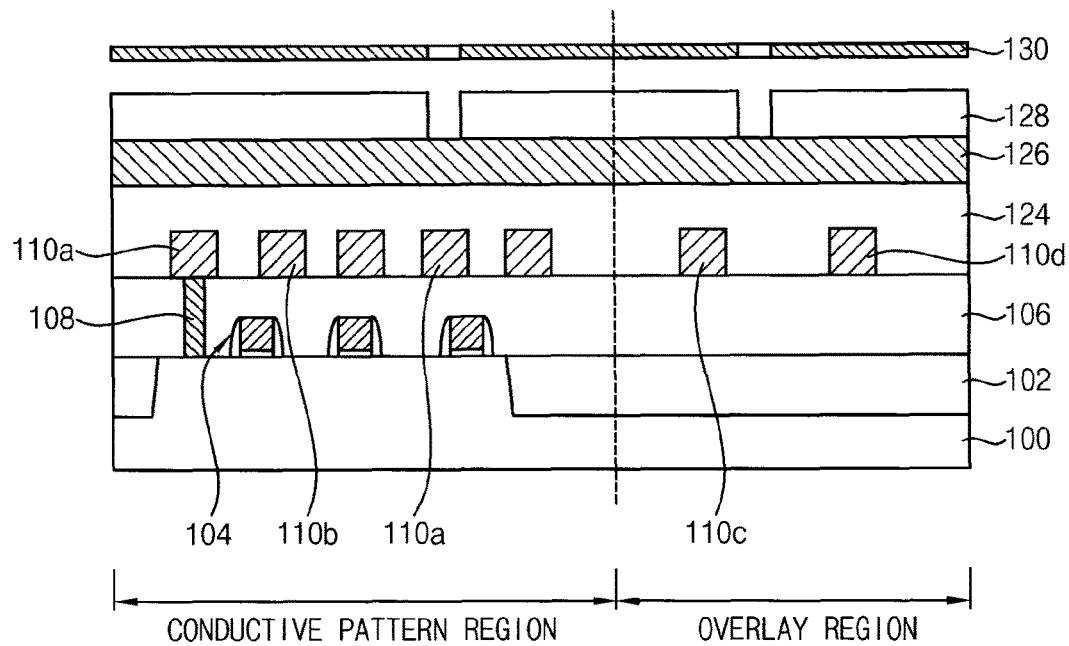

Referring to FIG. 5G, an insulating interlayer 124 may be formed that covers the first and second lower conductive patterns 110a and 110b and the first and second overlay keys 110c and 110d. A third hard mask layer 126 may be formed on the insulating interlayer 124. A third photoresist layer may be coated on the third hard mask layer 126. The third photoresist layer may be exposed using a third exposure mask 130. Using the third exposure mask 130, an upper conductive pattern in the first combination structure may be transferred to the third photoresist layer by the exposure process. A third photoresist pattern 128 may be formed by a developing process.

The exposure process with respect to the third photoresist layer may form a first contact hole. The first contact holes may be positioned over the first lower conductive patterns 110a, but not over the second lower conductive patterns 110b. In the exposure process, the third exposure mask 130 may be aligned using the first overlay key 110c, but not the second overlay key 110d.

According to exemplary embodiments, the first overlay key 110c may be used only during the first exposure process for the alignment of the third exposure mask 130, which may simplify a mask alignment process and reduce overlay defects.

Figure 5H:
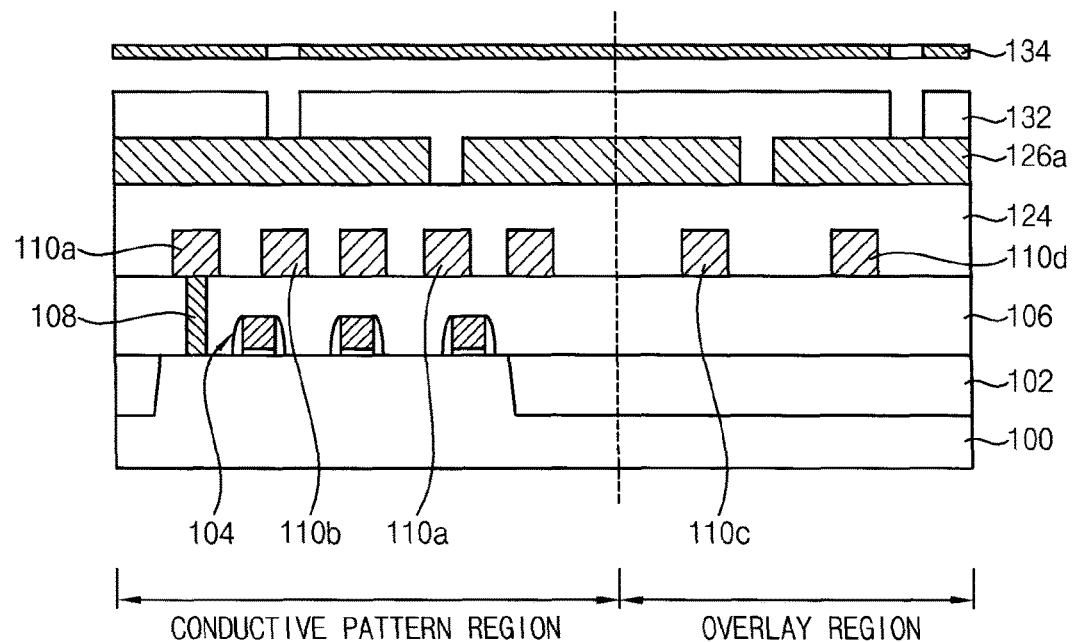

Referring to FIG. 5H, the third hard mask layer 126 may be etched using the third photoresist pattern 128 as an etching mask to form a third preliminary mask pattern 126a.

A fourth photoresist layer may be coated on the preliminary mask pattern 126a. The fourth photoresist layer may be exposed using a fourth exposure mask 134. Using the fourth exposure mask 134, the upper conductive pattern in the second combination structure may be transferred to the fourth photoresist layer by the exposure process. A fourth photoresist pattern 132 may be formed by a developing process.

The exposure process with respect to the fourth photoresist layer may form a second contact hole. The second contact holes may be positioned on the second lower conductive patterns 110b, but not on the first lower conductive patterns 110a. In the exposure process, the fourth exposure mask 134 may be aligned using the second overlay key 110d, but not the first overlay key 110c.

According to exemplary embodiments, the second overlay key 110d may be used only during the second exposure process for the alignment of the fourth exposure mask 134, which may simplify the mask alignment process and reduce overlay defects.

Figure 5I:
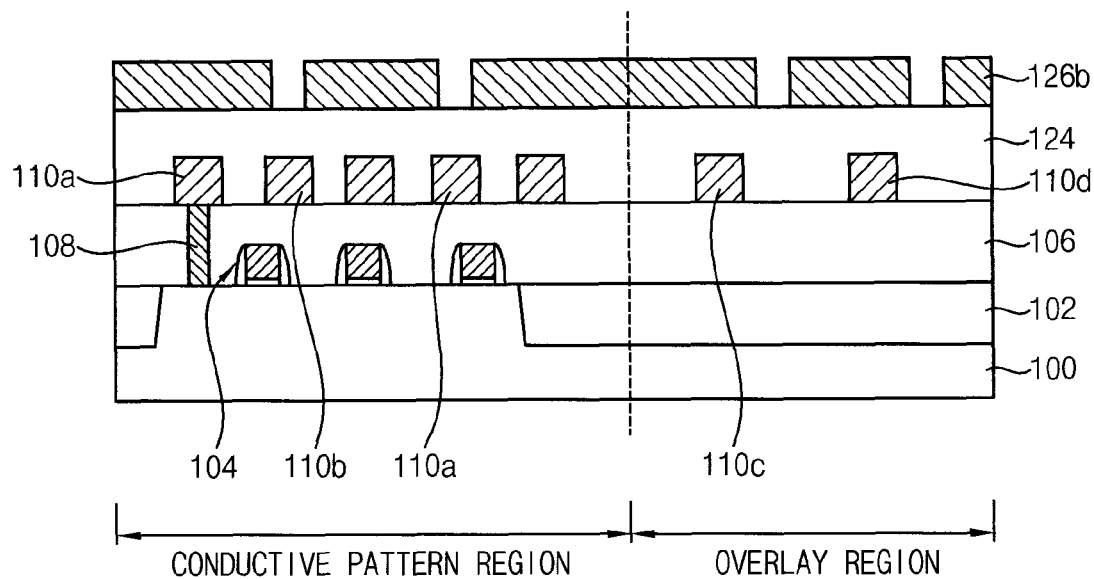

Referring to FIG. 5I, the third preliminary mask pattern 126a may be etched using the fourth photoresist pattern 132 as an etching mask to form a third mask pattern 126b.

Figure 5J:
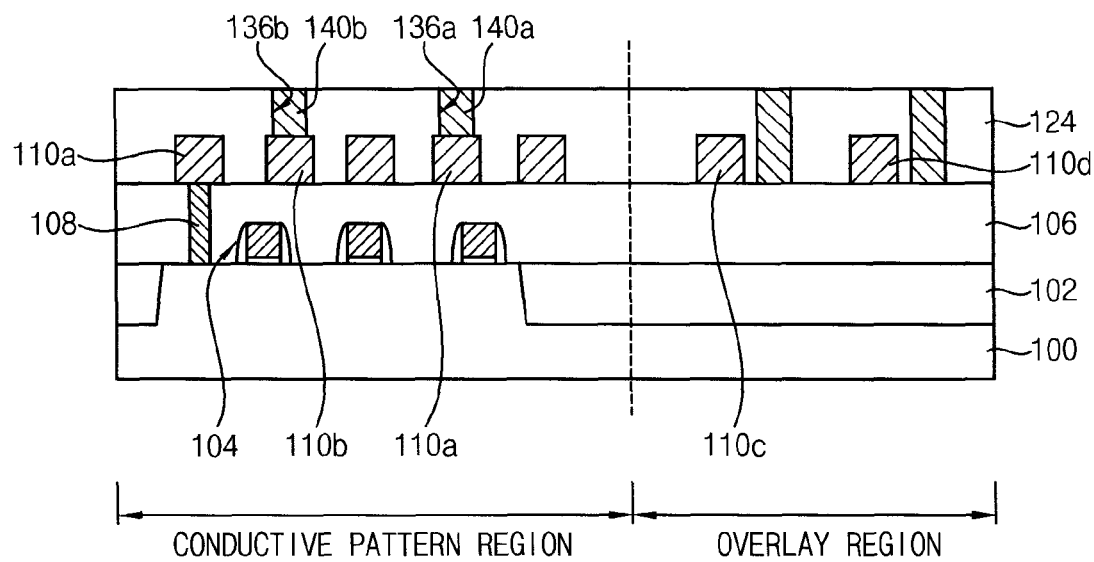

Referring to FIG. 5J, the insulating interlayer 124 may be etched using the third mask pattern 126b as an etching mask. Accordingly, a first contact hole 136a that exposes a top surface of the first lower conductive pattern 110a and a second contact hole 136b that exposes a top surface of the second lower conductive pattern 110b may be formed.

A conductive layer that substantially fills the first and second contact holes 136a and 136b may be formed, and then the conductive layer may be planarized to form first and second contact plugs 140a and 140b.

According to the processes described above, the semiconductor device including the lower conductive patterns and the contact holes in contact with the lower conductive patterns may be manufactured. According to exemplary embodiments, the target patterns formed by each exposure process may be easily divided in a double patterning process for forming the patterns of each layer. Additionally, the exposure mask may be easily aligned while forming the patterns of each layer, so that the overlay defect may be reduced.

Figure 6A:
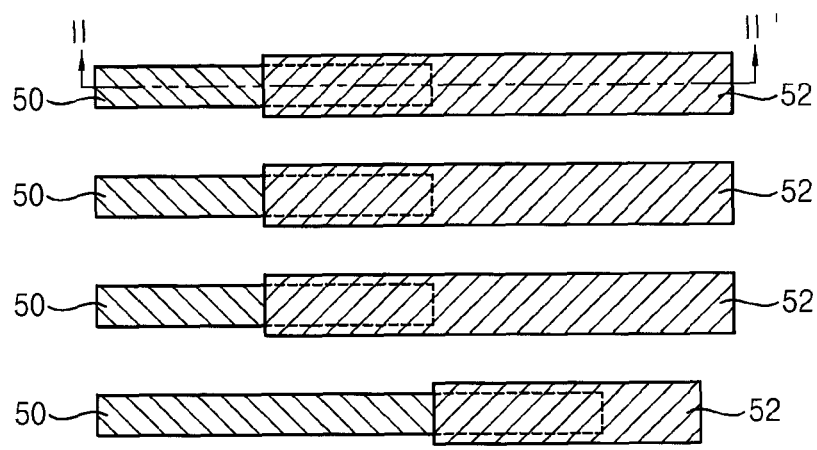
FIG. 6A is a top-plan view that illustrates a layout of target patterns in accordance with some exemplary embodiments.
Figure 6B:
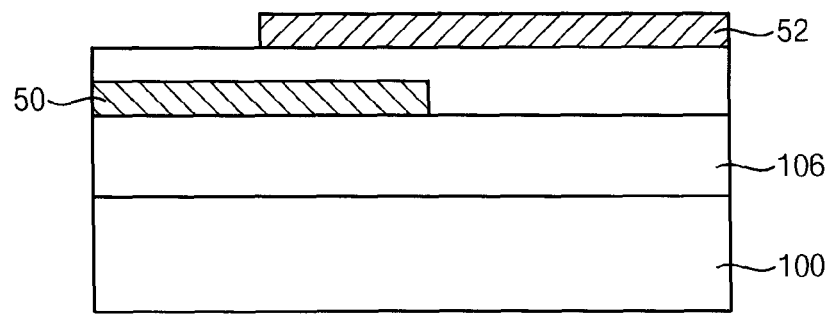
FIG. 6B is a cross-sectional view taken along a line II-II' of FIG. 6A.

FIG. 6A is a top-plan view that illustrates a layout of a target pattern in accordance with some exemplary embodiments. FIG. 6B is a cross-sectional view taken along a line II-II' of FIG. 6A. FIGS. 7A to 7D are top-plan views that illustrate a method of dividing the layout of FIG. 6A.

According to exemplary embodiments, the target patterns may include two layers of patterns. Each layer pattern may be formed by at least two exposure processes. Hereinafter, the layer patterns are formed by two exposure processes.

Referring to FIGS. 6A and 6B, the target patterns may be divided into lower target patterns 50 and upper target patterns 52. The lower and upper target patterns 50 and 52 may be substantially line patterns. The upper target pattern 52 may be aligned with the lower target pattern 50.

Figure 7A:
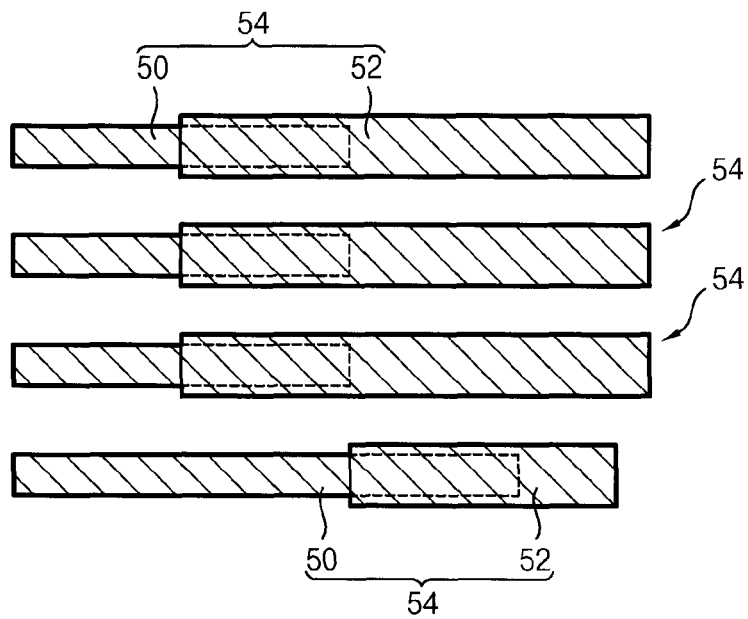
FIGS. 7A to 7D are top-plan views that illustrate a method of dividing the layout of FIG. 6A.

Referring to FIG. 7A, the lower target pattern 50 and the upper target pattern 52 may be combined with each other from target pattern layouts. The lower and upper target patterns 50 and 52 in the combination may at least partially make contact with or overlap each other.

The lower and upper target patterns 50 and 52 in the combination may change based on the target pattern layouts. The lower and upper target patterns 50 and 52 may be combined with each other in various structures based on to the layout.

For example, if the lower and upper target patterns 50 and 52 partially face each other, the lower and upper target patterns 50 and 52 may be combined into one structure.

Therefore, lower and upper target patterns 50 and 52 formed on different layers may be treated as one combination structure 54. A layout of the combination structure 54 may be created by the combination step.

Figure 7B:
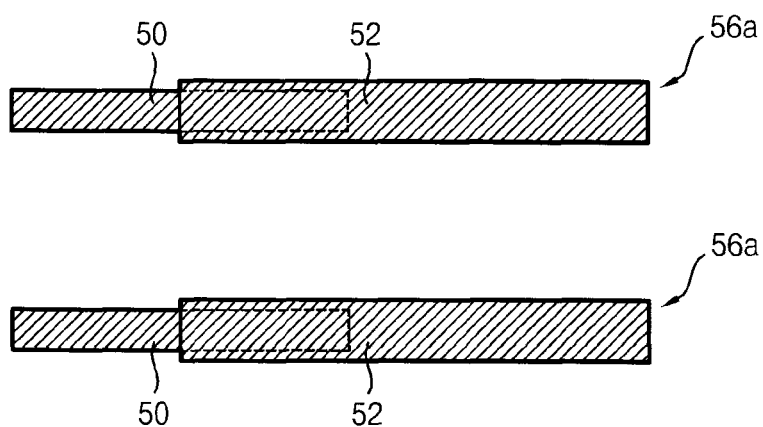
Figure 7C:
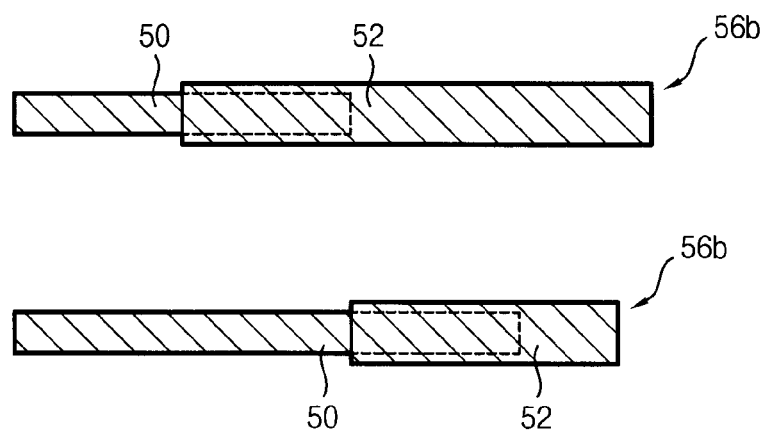

Referring to FIGS. 7B and 7C, the combination structures 54 may be divided according to each exposure process. For example, the combination structures 54 may be divided into a first combination structure 56a formed in a first exposure process and a second combination structure 56b formed in a second exposure process.

The target patterns in the first combination structure 56a may be formed in the first exposure process, and the target patterns in the second combination structure 56b may be formed in the second exposure process.

Figure 7D:
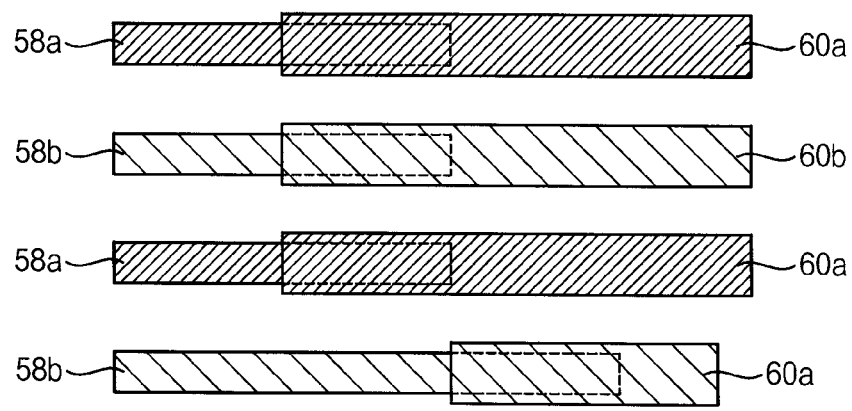

Referring to FIG. 7D, the lower target patterns 50 in the first combination structure 56a may be first target patterns 58a formed by the first exposure process. The lower target patterns 50 in the second combination structure 56b may be second target patterns 58b formed by the second exposure process. The upper target patterns 52 in the first combination structure 56a may be third target patterns 60a formed by the first exposure process. The upper target patterns 52 in the second combination structure 56b may be fourth target patterns 60b formed by the second exposure process.

The first target pattern 58a in the first combination structure 56a may be formed using a first exposure mask. The third target pattern 60a in the first combination structure 56a may be formed using a third exposure mask. The first and third exposure masks may be used in the first exposure process.

The second target pattern 58b in the second combination structure 56b may be formed using a second exposure mask. The fourth target pattern 60b in the second combination structure 56b may be formed using a fourth exposure mask. The second and fourth exposure masks may be used in the second exposure process.

The first to fourth exposure masks that form the first to fourth target patterns 58a, 58b, 60a and 60b may be inspected. If the first to fourth exposure masks are suitable for forming the first to fourth target patterns 58a, 58b, 60a and 60b, the layouts of the lower and upper target patterns 50 and 52 may be determined. For example, the first to fourth exposure masks used in each of the exposure processes for implementing the layout may be determined.

Alternatively, if the first to fourth exposure masks are unsuitable for forming the first to fourth target patterns 58a, 58b, 60a and 60b, the combination structure may be redivided and the subsequent processes may be repeated. In one exemplary embodiment, the lower and upper target patterns 50 and 52 may be recombined in a different structure, and then the subsequent processes may be repeated.

By the methods described above, the target patterns may be easily divided, which may reduce overlay defects.

Figure 8A:
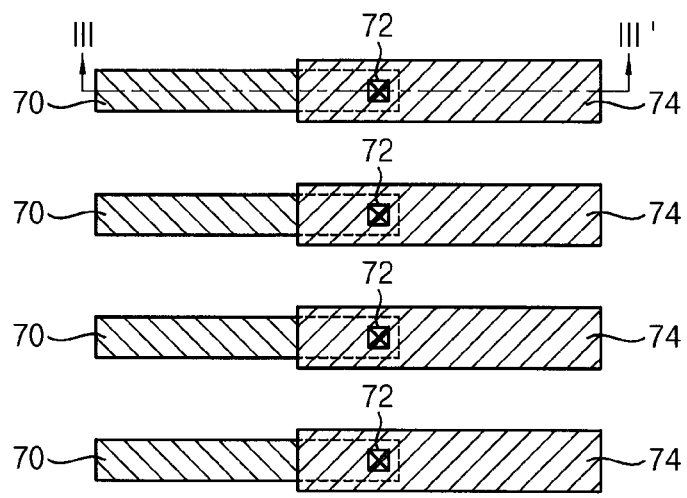
FIG. 8A is a top-plan view that illustrates a layout of target patterns in accordance with some exemplary embodiments.
Figure 8B:
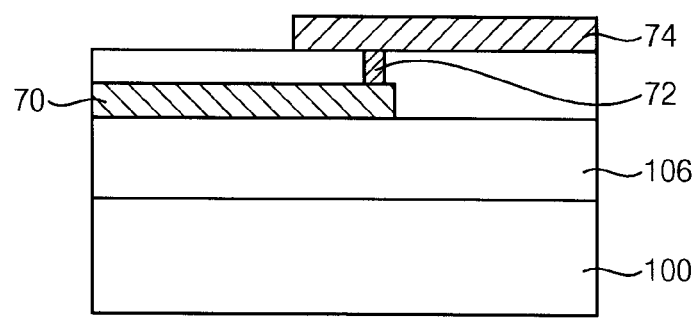
FIG. 8B is a cross-sectional view taken along a line of FIG. 8A.

FIG. 8A is a top-plan view that illustrates a layout of target patterns in accordance with some exemplary embodiments. FIG. 8B is a cross-sectional view taken along a line of FIG. 8A. FIGS. 9A to 9D are top-plan views that illustrate a method of dividing the layout of FIG. 8A.

According to some exemplary embodiments, the target patterns may include three pattern layers. Each pattern layer may be formed by at least two exposure processes. The layer patterns may be defined as the patterns obtained from one layer formed by the same deposition process. Hereinafter, each layer pattern is defined as being formed by two exposure processes.

Referring to FIGS. 8A and 8B, the target patterns may be divided into lower target patterns 70, middle target patterns 72 and upper target patterns 74. The lower and upper target patterns 70 and 74 may include line patterns. The line pattern may extend without bending, or may include a bend. The middle target pattern 72 may include a contact plug that connects the lower and upper target patterns 70 and 74 with each other. At least one contact plug may be in contact with the lower and upper target patterns 70 and 74.

Figure 9A:
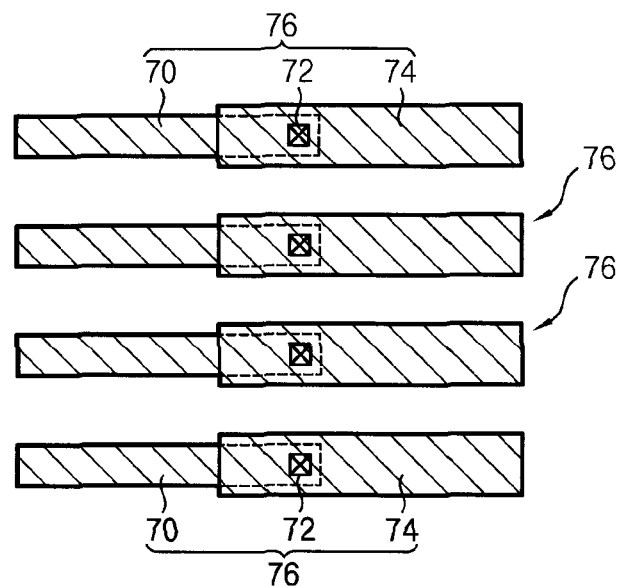
FIGS. 9A to 9D are top-plan views that illustrate a method of dividing the layout of FIG. 8A.

Referring to FIG. 9A, the lower, middle and upper target patterns 70, 72 and 74 may be aligned with each other and may be combined from the target patterns layout.

For example, the lower target pattern 70, the middle target pattern 72 in contact with a top surface of the lower target pattern 70, and the upper target pattern 74 in contact with a top surface of the middle target pattern 72 may be combined with one another. In some exemplary embodiments, the contact plug and the line patterns in contact with lower and upper portions of the contact plug may be combined to form a combination structure 76. Thus, the lower, middle and upper target patterns 70, 72 and 74 may be treated as one combination structure 76.

A combination structures 76 layout may be created by the combination step.

Figure 9B:
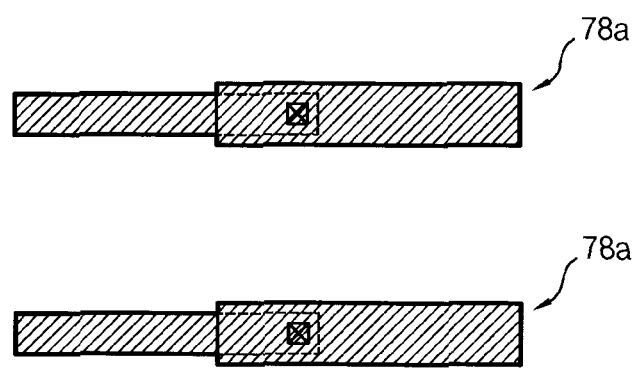
Figure 9C:
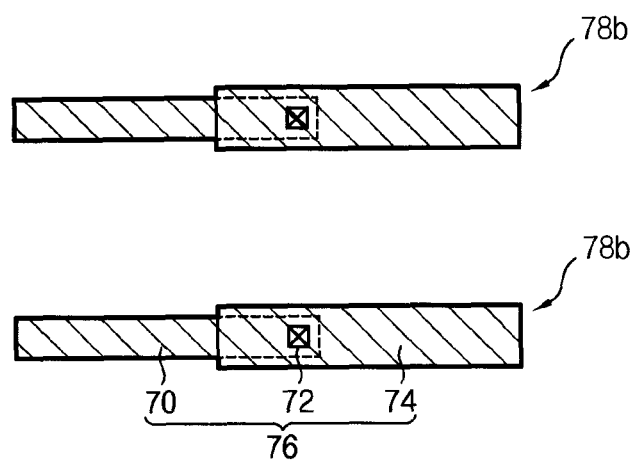

Referring to FIGS. 9B and 9C, the combination structures 76 may be divided according to each exposure process.

The combination structure illustrated in FIG. 9B may be a first combination structure 78a formed by a first exposure process. The combination structure illustrated in FIG. 9C may be a second combination structure 78b formed by a second exposure process.

The target patterns in the first combination structure 78a may be formed by the first exposure process, and the target patterns in the second combination structure 78b may be formed by the second exposure process.

Figure 9D:
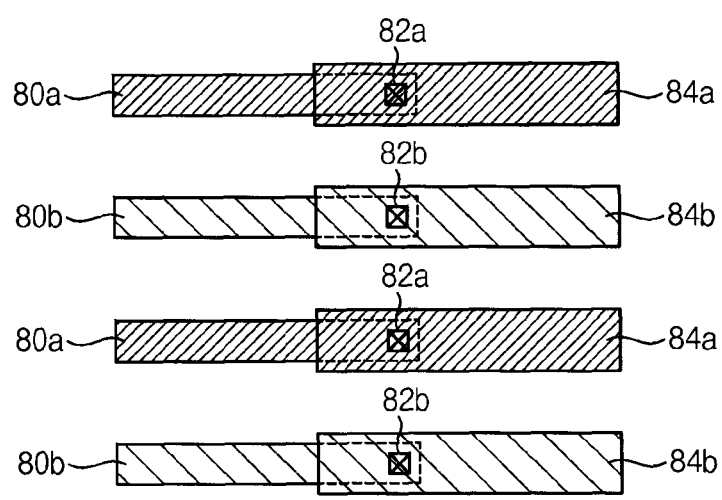

Referring to FIG. 9D, the lower target patterns 70 in the first combination structure 78a may be first target patterns 80a formed by the first exposure process. The lower target patterns 70 in the second combination structure 78b may be second target patterns 80b formed by the second exposure process. The middle target patterns 72 in the first combination structure 78a may be third target patterns 82a formed by the first exposure process. The middle target patterns 72 in the second combination structure 78b may be fourth target patterns 82b formed by the second exposure process. The upper target patterns 74 in the first combination structure 78a may be fifth target patterns 84a formed by the first exposure process. The upper target patterns 74 in the second combination structure 78b may be sixth target patterns 84b formed by the second exposure process.

Each target pattern may be formed using a different exposure mask. For example, the first to sixth target patterns 80a, 80b, 82a, 82b 84a and 84b may be formed using first to sixth exposure masks, respectively.

As described above, a layout that includes three layers of the target patterns may be divided by one division process, and the divided target patterns may be formed using different exposure masks.

The first to sixth exposure masks may be inspected to check whether or not the exposure masks are suitable for forming the target patterns.

If the first to sixth exposure masks are suitable for forming the target patterns, the first to sixth exposure masks may be determined.

Alternatively, if the first to sixth exposure masks are unsuitable for forming the target patterns, the combination structure may be redivided and the subsequent processes may be repeated. In one exemplary embodiment, the lower, middle and upper target patterns 70, 72 and 74 may be recombined in a different structure, and then the subsequent processes may be repeated.

By the methods described above, a layout that includes a plurality of target pattern layers may be easily divided, which may reduce overlay defects.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings of the present inventive concept. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor device, comprising:
    designing target pattern layouts, including layouts of lower target patterns and upper target patterns by using a computer;
    combining each lower target pattern with an upper target pattern that at least partially overlaps a top surface of the lower target pattern to form combination structures by using the computer;
    dividing the combination structures into a first combination structure and a second combination structure, wherein the first combination structure and the second combination structure are respectively formed by a first exposure process and a second exposure process by using the computer;
    forming first to fourth exposure masks, the first exposure mask and the third exposure mask being used for forming the lower target pattern and the upper target pattern in the first combination structure, the second exposure mask and the fourth exposure mask being used for forming the lower target pattern and the upper target pattern in the second combination structure;
    forming a first lower pattern from a first object layer on a substrate using the first exposure mask in a first lithography process;
    forming a second lower pattern from the first object layer using the second exposure mask in a second lithography process;
    forming an insulating interlayer and a second object layer on the first and second lower patterns;
    form a first upper pattern from the second object layer using the third exposure mask in a third lithography process; and
    forming a second upper pattern from the second object layer using the fourth exposure mask in a fourth lithography process.

2. The method of claim 1, further comprising aligning the lower and upper target patterns that form the combination structure with each other.

3. The method of claim 1, wherein the lower target pattern includes line patterns and the upper target pattern includes contact plugs in contact with top surfaces of the line patterns, and
    wherein the line pattern and the contact plugs in contact therewith form the combination structure.

4. The method of claim 3, further comprising:
    etching the insulating interlayer using the first and second upper patterns as an etching mask to form a contact hole; and
    filling the contact hole with a conductive material to form the contact plug.

5. The method of claim 1, further comprising inspecting the first to fourth exposure masks to judge suitability for forming the first to fourth target patterns.

6. The method of claim 1, further comprising forming a first overlay key in the first lithography process and forming a second overlay key in the second lithography process.

7. The method of claim 6, further comprising aligning the third exposure mask using the first overlay key in the third lithography process and aligning the fourth exposure mask using the second overlay key in the fourth lithography process.

8. A method of manufacturing a semiconductor device, comprising:
    forming first lower target patterns in a first exposure process using a first exposure mask;
    forming first upper target patterns in the first exposure process using a third exposure mask;
    forming second lower target patterns in a second exposure process using a second exposure mask;
    forming second upper target patterns in the second exposure process using a fourth exposure mask,
    wherein the first and second lower target patterns and the first and second upper target patterns are line patterns;
    aligning the first and second upper target patterns with the first and second lower target patterns from target pattern layouts, respectively;
    combining the first lower target patterns and the first upper target patterns to form a first combination structure; and
    combining the second lower target patterns and the second upper target patterns to form a second combination structure,
    wherein the lower and upper target patterns are combined using target pattern layouts that are divided into lower target pattern layouts and upper target pattern layouts.

9. The method of claim 8, further comprising inspecting the first to fourth exposure masks to judge whether the first to fourth exposure masks are suitable for forming the first to fourth target patterns, wherein if the first to fourth exposure masks are judged as unsuitable for forming the first to fourth target patterns, the target pattern layouts are redivided into lower target pattern layouts and upper target pattern layouts, and the lower and upper target patterns are recombined into a different structure.

10. The method of claim 8, further comprising:

forming first middle target patterns in the first exposure process using a fifth exposure mask;

forming second middle target patterns in the second exposure process using a sixth exposure mask;

aligning the first middle target patterns with the first lower and upper target patterns, and the second middle target patterns with the second lower and upper target patterns;

combining the first middle target patterns with the first lower and upper target patterns, and the second middle target patterns with the second lower and upper target patterns, wherein first and second middle target patterns include contact plugs that respectively connect the first lower and upper target patterns, and the second lower and upper target patterns, and the target pattern layouts are further divided into middle target pattern layouts.

11. The method of claim 10, further comprising inspecting the first to sixth exposure masks to judge whether the first to fourth exposure masks are suitable for forming the first to fourth target patterns, wherein if the first to sixth exposure masks are judged as unsuitable for forming the first to fourth target patterns, the target pattern layouts are redivided into lower target pattern layouts, middle target pattern layouts, and upper target pattern layouts, and the lower, middle, and upper target patterns are recombined into a different structure.

* * * * *